United States Patent
Meng et al.

(10) Patent No.: US 11,322,701 B2
(45) Date of Patent: May 3, 2022

(54) HIGH DIELECTRIC CONSTANT COMPOSITE MATERIAL AND APPLICATION THEREOF

(71) Applicant: PEKING UNIVERSITY SHENZHEN GRADUATE SCHOOL, Shenzhen (CN)

(72) Inventors: Hong Meng, Shenzhen (CN); Jupeng Cao, Shenzhen (CN); Lijia Yan, Shenzhen (CN); Yu He, Shenzhen (CN); Xiaoyun Wei, Shenzhen (CN); Yanan Zhu, Shenzhen (CN); Ting Li, Shenzhen (CN)

(73) Assignee: PEKING UNIVERSITY SHENZHEN GRADUATE SCHOOL, Shenzhen (CN)

( * ) Notice: Subject to any disclaimer, the term of this patent is extended or adjusted under 35 U.S.C. 154(b) by 171 days.

(21) Appl. No.: 16/622,426

(22) PCT Filed: Sep. 6, 2017

(86) PCT No.: PCT/CN2017/100677
§ 371 (c)(1),
(2) Date: Dec. 13, 2019

(87) PCT Pub. No.: WO2018/227788
PCT Pub. Date: Dec. 20, 2018

(65) Prior Publication Data
US 2020/0106034 A1    Apr. 2, 2020

(30) Foreign Application Priority Data
Jun. 15, 2017   (CN) .................. 2017104513170.0

(51) Int. Cl.
*H01L 29/08*    (2006.01)
*H01L 51/05*    (2006.01)

(52) U.S. Cl.
CPC ........ *H01L 51/052* (2013.01); *H01L 51/0541* (2013.01); *H01L 51/0545* (2013.01)

(58) Field of Classification Search
CPC .............. H01L 51/052; H01L 51/0541; H01L 51/0545
See application file for complete search history.

(56) References Cited

U.S. PATENT DOCUMENTS

| 2012/0263933 A1* | 10/2012 | Higuchi | C08J 7/043 428/217 |
| 2015/0243915 A1 | 8/2015 | Wigglesworth et al. | |
| 2016/0349614 A1* | 12/2016 | Wright | G03F 7/0758 |

FOREIGN PATENT DOCUMENTS

| CN | 1607685 A | 4/2005 |
| CN | 101257041 A | 9/2008 |

OTHER PUBLICATIONS

International Search Report dated Mar. 15, 2018 in corresponding International application No. PCT/CN2017/100677; 4 pages.
Kim et al., "Printable Cross-Linked Polymer Blend Dielectrics. Design Strategies, Synthesis, Microstructures, and Electrical Properties, with Organic Field-Effect Transistors as Testbeds", American Chemical Society, 2008, pp. 6867-6878, vol. 130, No. 21; 12 pages.

* cited by examiner

*Primary Examiner* — Victor A Mandala
*Assistant Examiner* — Colleen E Snow
(74) *Attorney, Agent, or Firm* — Maier & Maier, PLLC

(57) ABSTRACT

A high dielectric constant composite material and method for preparing organic thin film transistor using the material as dielectric. The method includes: using sol-gel method, hydrolyzing terminal group-containing silane coupling agent to form functional terminal group-containing silica sol, cross-linked with organic polymer to form composite sol as material of dielectric of organic thin film transistor; forming film by solution method such as spin coating, dip coating, inkjet printing, 3D printing, etc., forming dielectric after curing; preparing semiconductor and electrode respectively to prepare organic thin film transistor device, which, based on composite dielectric material, has mobility of 5 cm2/V·s, exceeding that of using SiO2, having low threshold voltage and no hysteresis effect. Compared with traditional processes like SiO2 thermal oxidation, above method has advantages of simple process, low cost, suitable for large-area preparation, with great market application value.

9 Claims, 6 Drawing Sheets

HIGH DIELECTRIC CONSTANT COMPOSITE MATERIAL AND APPLICATION THEREOF

FIELD

The present disclosure relates to the field of organic semiconductor devices, and, more particularly, to a high dielectric constant composite material and a method for preparing a thin film transistor using the material as a dielectric.

BACKGROUND

An organic thin film transistor (OTFT) is a logic switching device adopting an organic semiconductor material as an active layer. Due to an organic material having a high machinability, OTFT has become a core of a plurality of flexible electronic technologies including a sensor, an integrated circuit, an OLED displayer, a wearable device and more. As a basic component of a circuit, a driving voltage, a mobility and a hysteresis effect are a plurality of important indicators for measuring whether an organic thin film transistor device is able to be applied on market. FIG. 1 illustrates a schematic diagram on an organic thin film transistor having a bottom-gate top-contact structure, the organic thin film transistor has five layers, from bottom up, it is a substrate, a gate, a dielectric, an organic semiconductor, and a source and drain respectively. Similarly, FIG. 2 illustrates a schematic diagram of an organic thin film transistor having a bottom-gate bottom-contact structure; FIG. 3 illustrates a schematic diagram of an organic thin film transistor having a top-gate top-contact structure; and FIG. 4 illustrates a schematic diagram of an organic thin film transistor having a top-gate bottom-contact structure.

A main role of the dielectric in a thin film transistor is inducing a plurality of carriers in a semiconductor under an electric field condition, and forming a conductive path between a source and a drain, A concentration of the carriers in the semiconductor mainly depends on a permittivity of the dielectric. Under a condition having a certain thickness, a material having a high dielectric constant k tends to be polarized at a small voltage and induce a generation of the carriers in the organic semiconductor, forming a conductive channel.

Currently, a widely used dielectric material is mostly an inorganic silica ($SiO_2$, K~3.9), the driving voltage of a device thereof is as high as 60V, and in a practical application, due to a defect that a power consumption is high, it is not conducive to an application thereof; while a plurality of inorganic materials having a high dielectric constant, including $BaTiO_3$, $Ta_2O_5$, $TiO_2$, $ZrO_2$, $Si_3N_4$, and more, due to a plurality of defects including a processing technology and a plurality of equipment requirements high, and the mobility of a device low, an application and expansion has been limited in the thin film transistor. In recent years, a large number of organic dielectric materials have been gradually applied in practice, including PMMA, PS, PVP, CYTOP, and more, although an organic dielectric material has been widely concerned with a plurality of excellent properties including being able to be processed in a solution, a device fabricated from an organic material has often serious hysteresis, and is susceptible to oxygen and water in the environment, resulting in a device performance unstable, which has greatly limited an application thereof. A plurality of researchers has optimized a device performance thereof in terms of a device structure, a fabrication process, and a material. For example, the Chinese patent CN201610768689.1 uses a double crosslinked polymer as a dielectric and uses a plurality of liquid organic small molecules for a surface modification, which has optimized a property of the dielectric and a contact between the dielectric and the active layer, and improved a performance of the organic thin film transistor. The Chinese patent CN201210091404.7 selects a suitable material system and process and produces a low voltage (2V) organic thin film transistor by reducing a subthreshold swing magnitude of a device.

The material of the dielectric in the organic thin film transistor is either a single organic or inorganic material, or a superposed structure of a multilayer dielectric, or a simple doping of an organic-inorganic material, although a better performance may be shown in some respects, a plurality of problems including a high power consumption, a poor stability, a low mobility and a high process cost for an industrial application are still not been effectively solved.

SUMMARY

According to the above described defects, the purpose of the present disclosure is providing a composite material having a high dielectric constant and a method for preparing a thin film transistor using the material as a dielectric, in order to overcome a plurality of defects and shortcomings of an organic or inorganic dielectric material in a real practice in a plurality of aspects including the power consumption, the stability, the mobility, the process cost and more.

A technical solution of the present disclosure to solve the technical problems is as follows: providing a method for preparing the dielectric material, wherein by a sol-gel method, a silane coupling agent containing terminal group is co-hydrolyzed under an action of a catalyst to form a silica sol containing functional terminal group, then mixed with an organic polymer, and stirred in a constant temperature, an organic-inorganic composite sol is formed after reaction, which is applied as a material of the dielectric in the organic thin film transistor.

The method for preparing the dielectric material provided in the present disclosure, wherein the silane coupling agent containing terminal group is at least one of γ-aminopropyltrimethoxysilane (KH540), aminopropyltriethoxysilane (KH550), 3-glycidoxypropyltrimethoxysilane (KH560), γ-methacryloxypropyltrimethoxysilane (KH570), vinyltriethoxysilane (A-151), vinyl-trimethoxysilane (A-171), N-(β-aminoethyl)-γ-aminopropyltriethoxysilane (KH-791), N-(β-aminoethyl)-γ-aminopropyltrimethoxysilane (KH-792), γ-mercaptopropyltriethoxysilane (KH-901), γ-mercaptopropyltrimethoxysilane, phenyltrimethoxysilane (KH-161), phenyltriethoxysilane (KH-162), methyltriethoxysilane (MTES), ethyltriethoxysilane (ETES), octadecyltrimethoxysilane, dodecyltrimethoxysilane, n-octadecyltrichlorosilane, n-hexadecyltrichlorosilane, n-dodecyltrichlorosilane, n-octyltrichlorosilane, γ-chloropropyltrichlorosilane, chloropropylmethyldichlorosilane, perfluorododecyltrichlorosilane, heptadecafluorodecyltripropoxysilane, heptadecafluorodecyltriethyloxysilane, heptadecafluorodecyltrimethoxysilane, heptadecafluorodecyltriisopropoxysilane, tridecafluorooctyltriethoxysilane, tridecafluorooctyltrimethoxysilane, tridecafluorooctyltrichlorosilane, tridecafluorohexylpropyltriethoxysilane, dodecafluoroheptylpropyldimethoxysilane, dodecafluoroheptylpropyltrimethoxysilane, trifluoropropyltriethoxysilane, monofluorotriethoxysilane, pentafluorophenyltriethoxysilane, cyanoethylmethyldimethoxysilane, tetraethyl orthosilicate.

The method for preparing the dielectric material provided in the present disclosure, wherein the functional terminal group in the silica sol containing functional terminal group is at least one of a halogen, a vinyl, a thiol, an amino, an epoxy, an ester; while the halogen is F, Cl, Br, I or more.

The method for preparing the dielectric material provided in the present disclosure, wherein a structural formula of the silane coupling agent used is as formula 1 below, and the reaction of the silane coupling agent hydrolyzing and forming a sol is as formula 2 below:

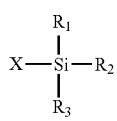

(1)

wherein X is a side chain containing a group of

—F, —Cl, —Br, —I, —C(H)=CH$_2$, —NH$_2$, —SH, 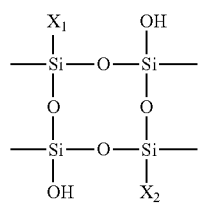

and more; R$_1$, R$_2$, R$_3$ is one or two of —OCH$_3$, —OCH$_2$CH$_3$.

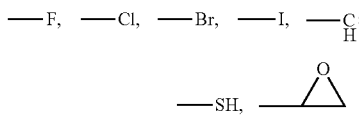

(2)

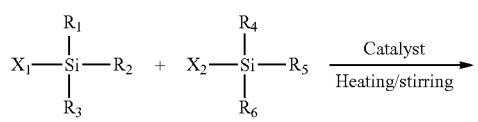

wherein at least one of X$_1$ or X$_2$ contains a side chain group of

—F, —Cl, —Br, —I, —C(H)=CH$_2$, —NH$_2$, —SH, 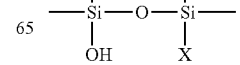

and more; R$_1$, R$_2$, R$_3$, R$_4$, R$_5$, R$_6$ is one or two of —OCH$_3$, —OCH$_2$CH$_3$.

The method for preparing the dielectric material provided in the present disclosure, wherein a structure of the organic polymer is as formula 3 below:

(3)

wherein Z is a side chain containing a group of

—OH, —C(H)=CH$_2$, —NH$_2$, 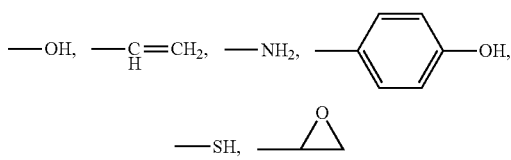, —SH, and more.

The method for preparing the dielectric material provided in the present disclosure, wherein a cross-linking reaction for forming the organic-inorganic composite sol is a reaction of a condensation between hydroxyl groups, a double bond addition, an epoxy ring-opening polymerization, a thiol group and a double bond polymerization or more, preferably, a reaction process is as formula 4 or formula 5 below:

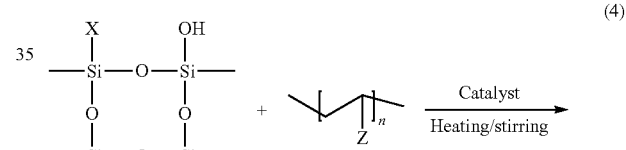

(4)

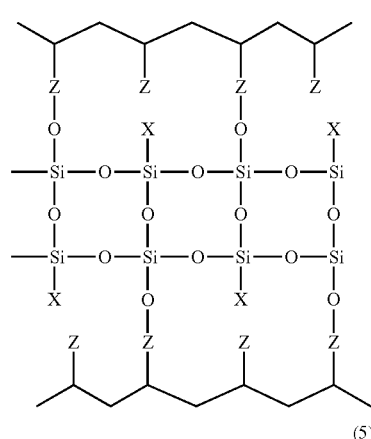

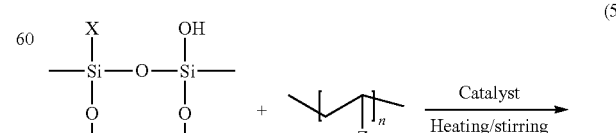

(5)

-continued

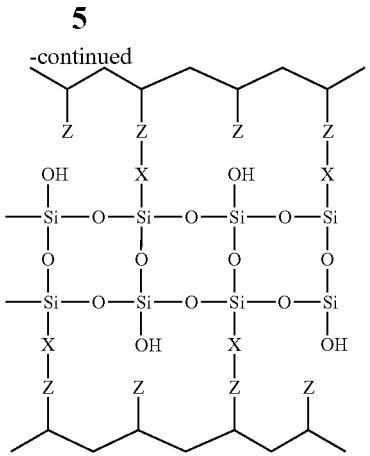

The method for preparing the dielectric material provided in the present disclosure, wherein the organic polymer is one or more of polyvinyl alcohol (PVA), polymethyl methacrylate (PMMA), polystyrene (PS), poly(p-vinylphenol) (PVP), poly-α-methylstyrene (PαMS), polyisobutylene (FIB), polypropylene (PP), polyvinylidene fluoride (PVDF), polyvinyl chloride (PVC), polyester (PET), perfluoro resin (CYTOP), polyurethane, acrylate, polyurethane acrylate, epoxy resin.

The method for preparing the dielectric material provided in the present disclosure, wherein the catalyst is one or more of hydrochloric acid, sulfuric acid, phosphoric acid, acetic acid, oxalic acid, succinic acid, citric acid, sorbic acid, terephthalic acid, sodium hydroxide, potassium hydroxide, ammonia, sodium bicarbonate, disodium hydrogen phosphate, 2-amino-2-methyl-1-propanol, N-methylethanolamine, butylethanolamine, triethanolamine, N-aminopropyl-methylethanolamine, ammonium chloride.

The method for preparing the dielectric material provided in the present disclosure, wherein comprising a plurality of following steps:

S1, adding a quantitative silane coupling agent containing terminal group and a certain proportion of a solvent to a round bottom flask, before being heated in an oil bath at a temperature of 50-100° C. and stirred for 0.5-5 h;

S2, adding an appropriate amount of a catalyst to make an pH value of the solution at 2-6 or 8-12, continue stirring for 1-2 hours, before obtaining a silica sol containing functional terminal group;

S3, heating and dissolving the organic polymer in a solvent at 80° C. for 1-5 h, before obtaining an organic polymer solution in a certain concentration for use;

S4, adding the organic polymer solution to the silica sol containing functional terminal group, and stirring for 2 h at 60° C., before obtaining an organic-inorganic hybrid composite sol.

The method for preparing the dielectric material provided in the present disclosure, wherein the solvent in the step S1 is one or more of deionized water, methanol, ethanol, propanol, isopropanol, benzyl alcohol, ethylene glycol, glycerol; the solvent in the step S3 is one or more of deionized water, methanol, ethanol, ethylene glycol, acetone, toluene, dichloromethane, ethyl acetate, chloroform, hexane, cyclohexane, tetrahydrofuran.

The present disclosure further provides a dielectric of an organic thin film transistor, using the dielectric material prepared by the method described above and forming an organic-inorganic composite film containing functional terminal group on a substrate to form the dielectric after being cured. Preferably, a solution method, including spin coating, dip coating, ink jet printing, 3D printing or more, may be configured to form the organic-inorganic composite film containing functional terminal group on a substrate.

The dielectric of the organic thin film transistor provided by the present disclosure, wherein the organic-inorganic composite film has a film thickness of 50-2000 nm; and a curing mode is heat curing or light curing.

The present disclosure further provides an organic thin film transistor, wherein adopting a vacuum evaporation method to plate an organic semiconductor and electrodes on the dielectric respectively, before obtaining the organic thin film transistor.

The organic thin film transistor provided in the present disclosure, wherein the organic semiconductor is a p-type semiconductor or an n-type semiconductor, including pentacene, polythiophene (P3HT), fullerene ($C_{60}$), Hexadecafluorophthalocyanine Copper(II) ($F_{16}CuPc$) and more; the organic thin film transistor has any one of a bottom-gate bottom-contact structure, a bottom-gate top-contact structure, a top-gate bottom-contact structure, or a top-gate top-contact structure; the source and the drain are one or two of gold, silver, aluminum, copper, calcium, and Indium tin oxide (ITO).

The dielectric material in the present disclosure may be processed by a solution method, including spin coating, dip coating, ink jet printing, 3D printing or more, which has a plurality of advantages including a low cost, a simple process, applicable for a large area preparation and more, comparing to a conventional preparation method of thermal oxidation, chemical vapor deposition and more, for a dielectric material of $SiO_2$.

The organic thin film transistor provided in the present disclosure has not only a mobility of 5 cm2/V·s, which is far beyond the mobility of a device using the $SiO_2$ as the dielectric, but also owns a plurality of characters of a low threshold voltage, no hysteresis effect and more, thus owns a good market application value.

The present disclosure has a plurality of following benefits: the present disclosure prepares a composite material having a high dielectric constant by using a method of compounding an organic dielectric material with an inorganic dielectric material, and prepares a dielectric film having small surface roughness (Ra) and good density by adopting a solution method, the film exhibits in a transistor with ultra-low voltage driving, high mobility, no hysteresis and excellent environmental stability, which is beneficial to an industrial application of the OTFT.

BRIEF DESCRIPTION OF THE DRAWINGS

In order to illustrate a plurality of embodiments of the present disclosure or a plurality of technical solutions in the prior art more clearly, a plurality of drawings used in the embodiments or describing the prior arts will be briefly described hereafter. Obviously, the drawings described hereafter are only some of the embodiments of the present disclosure, and those skilled in the art may obtain other drawings according to the drawings below without any creative work.

DETAILED DESCRIPTION OF EMBODIMENTS

Figure 1:
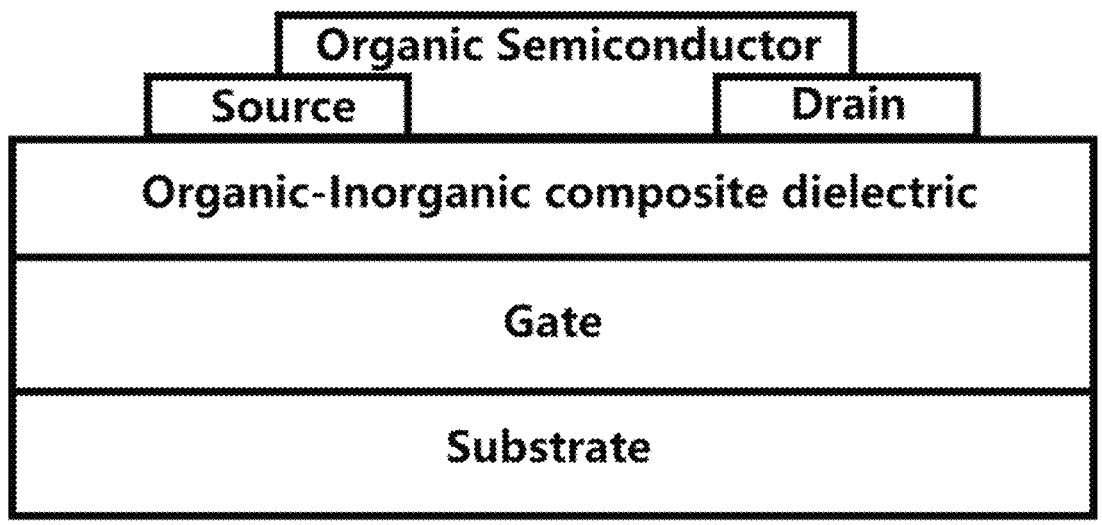
FIG. 1 illustrates a schematic view of an organic thin film transistor having a bottom-gate top-contact structure.
Figure 2:
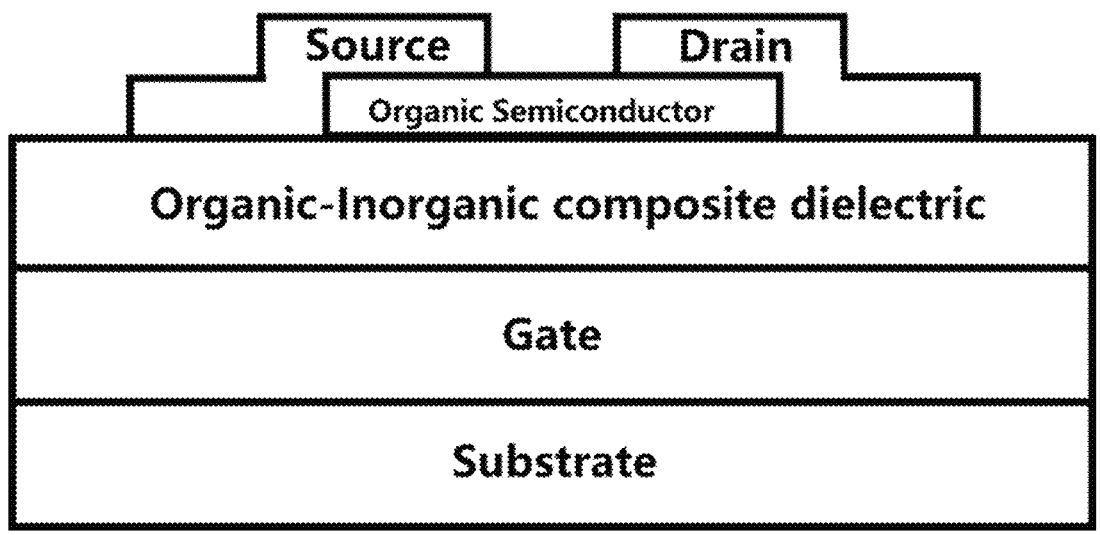
FIG. 2 illustrates a schematic view of an organic thin film transistor having a bottom-gate bottom-contact structure.
Figure 3:
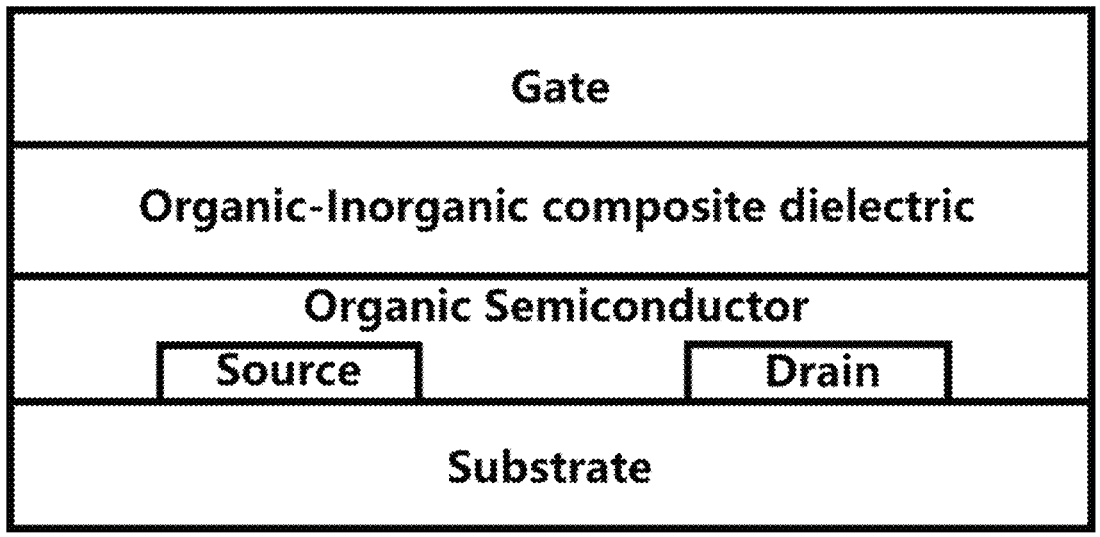
FIG. 3 illustrates a schematic view of an organic thin film transistor having a top-gate top-contact structure.
Figure 4:
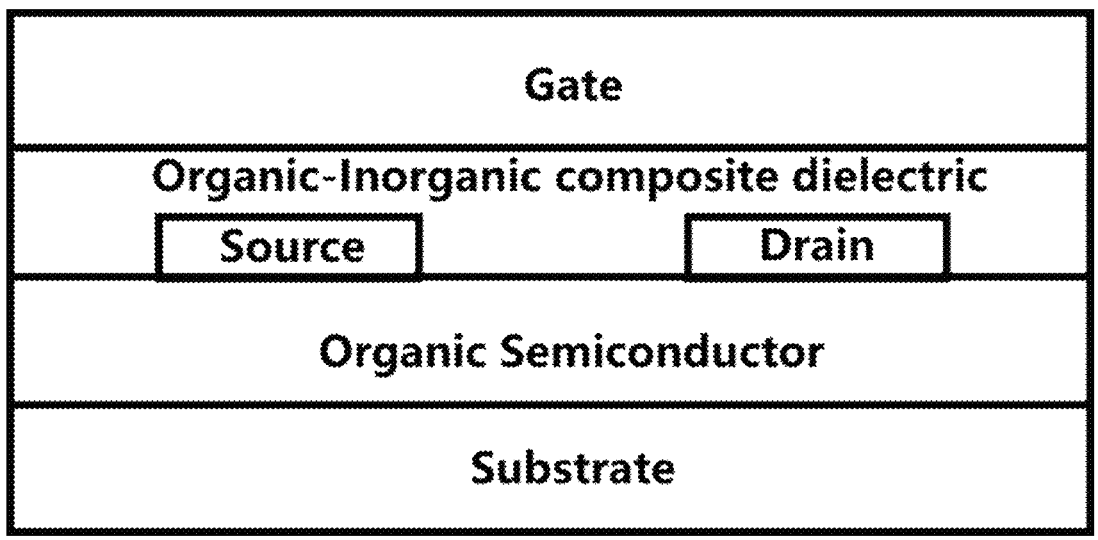
FIG. 4 illustrates a schematic view of an organic thin film transistor having a top-gate bottom-contact structure.

In order to achieve the purpose of the present disclosure, a polyvinyl alcohol (PVA) is adopted as an organic polymer material, which is commercially available, while a tetraethyl orthosilicate (TEOS) and a dodecafluoroheptylpropyltrimethoxysilane (Actyflon-G502) are adopted as silane coupling agents, which are both industrial products. Further detailed descriptions of the present disclosure are stated herein, referencing to the embodiments of the present disclosure. It should be understood that the detailed embodiments of the disclosure described here are used to explain the present disclosure only, instead of limiting the present disclosure.

Embodiment 1

A conventional thermally oxidized $SiO_2$ is adopted as a dielectric, and a silicon wafer of $SiO_2$/Si as a substrate, a gate and a dielectric, wherein a thickness of the $SiO_2$ is 300 nm. Specifically: after the silicon wafer is ultrasonically cleaned by deionized water, ethanol, acetone, and isopropyl alcohol, it is then treated by plasma/$O_3$, before a pentacene in 40 nm and a gold electrode of 50 nm are evaporated respectively on it by a mask board having an aspect ratio of 1:10 to form an OTFT device, a plurality of related performance tests are then performed.

Embodiment 2

A PVA is adopted as the dielectric, and a heavily doped silicon wafer as a substrate and a gate. Specifically: 0.4 g PVA is dissolved in hot water of 19.6 g to prepare a PVA solution of 2%, which is then filtrated and spin coated at a rotation speed of 1000-8000 rpm on the silicon wafer which has been cleaned in the same manner as in the embodiment 1. Followed by placed in an oven at 80° C. and cured by heat for 1 h, and forming a dielectric thin film, before a pentacene in 40 nm and a gold electrode of 50 nm are evaporated respectively on the dielectric thin film by a mask board having an aspect ratio of 1:10 to form an OTFT device, a plurality of related performance tests are then performed.

Embodiment 3

A $SiO_2$ prepared by a sol-gel method is adopted as the dielectric, and a heavily doped silicon wafer as the substrate and the gate. Specifically: 10 g TEOS is added to 40 g ethanol, stirring at 70° C. for 1 h, followed by adding appropriate amount of 2 mol/L hydrochloric acid to adjust a PH value of the solution to 2-6, keeping the temperature for 2 h, before cooling to room temperature, and obtaining a $SiO_2$ sol in transparent, which is then filtrated and spin coated at a rotation speed of 1000-8000 rpm on the silicon wafer which has been cleaned in the same manner as in the embodiment 1. Followed by placed in an oven at 80° C. and cured by heat for 1 h, and forming a dielectric thin film, before a pentacene in 40 nm and a gold electrode of 50 nm are evaporated respectively on the dielectric by a mask board having an aspect ratio of 1:10 to form an OTFT device, a plurality of related performance tests are then performed.

Embodiment 4

A fluorine-containing polysilsesquioxane prepared by the sol-gel method is adopted as the dielectric, and a heavily doped silicon wafer as the substrate and the gate. Specifically: 5 g TEOS and 5 g G502 siloxane are added to 40 g ethanol, stirring at 70° C. for 1 h, followed by adding appropriate amount of 2 mol/L hydrochloric acid to adjust a PH value of the solution to 2-6, keeping the temperature for 2 h, before cooling to room temperature, and obtaining a $SiO_2$ sol in transparent, which is then filtrated and spin coated at a rotation speed of 1000-8000 rpm on the silicon wafer which has been cleaned in the same manner as in the embodiment 1. Followed by placed in an oven at 80° C. and cured by heat for 1 h, and forming a dielectric thin film, before a pentacene in 40 nm and a gold electrode of 50 nm are evaporated respectively on the dielectric thin film by a mask board having an aspect ratio of 1:10 to form an OTFT device, a plurality of related performance tests are then performed.

Embodiment 5

A composite sol prepared by the sol-gel method is adopted as the dielectric, and a heavily doped silicon wafer as the substrate and the gate. Specifically: first, 0.4 g PVA is dissolved in hot water of 19.6 g, before preparing a PVA solution of 2% for use, then 10 g TEOS is added to 40 g ethanol, stirring at 70° C. for 1 h, followed by adding appropriate amount of 2 mol/L hydrochloric acid to adjust a PH value of the solution to 2-6, keeping the temperature for 2 h, before cooling to room temperature, and obtaining a $SiO_2$ sol in transparent, then the PVA solution of 2% and the $SiO_2$ sol are mixed at a mass ratio of 1:1, and stirred at a constant temperature of 60° C. for 2 h, and a composite sol is obtained after cooling, which is then filtrated and spin coated at a rotation speed of 1000-8000 rpm on the silicon wafer which has been cleaned in the same manner as in the embodiment 1. Followed by placed in an oven at 80° C. and cured by heat for 1 h, and forming a dielectric thin film, before a pentacene in 40 nm and a gold electrode of 50 nm are evaporated respectively on the dielectric thin film by a mask board having an aspect ratio of 1:10 to form an OTFT device, a plurality of related performance tests are then performed.

Embodiment 6

A fluorine-containing composite sol prepared by the sol-gel method is adopted as the dielectric, and a heavily doped silicon wafer as the substrate and the gate. Specifically: first, 0.4 g PVA is dissolved in hot water of 19.6 g, before preparing a PVA solution of 2% for use, then 5 g TEOS and 5 g G502 siloxane are added to 40 g ethanol, stirring at 70° C. for 1 h, followed by adding appropriate amount of 2 mol/L hydrochloric acid to adjust a PH value of the solution to 2-6, keeping the temperature for 2 h, before cooling to the room temperature, and obtaining a fluorine-containing $SiO_2$ sol in transparent, then the PVA solution of 2% and the fluorine-containing $SiO_2$ sol are mixed at a mass ratio of 1:1, and stirred at a constant temperature of 60° C. for 2 h, and a fluorine-containing composite sol is obtained after cooling, which is then filtrated and spin coated at a rotation speed of 1000-8000 rpm on the silicon wafer which has been cleaned in the same manner as in the embodiment 1. Followed by placed in an oven at 80° C. and cured by heat for 1 h, and forming a dielectric thin film, before a pentacene in 40 nm and a gold electrode of 50 nm are evaporated respectively on the dielectric thin film by a mask board having an aspect ratio of 1:10 to form an OTFT device, a plurality of related performance tests are then performed.

Figure 5:
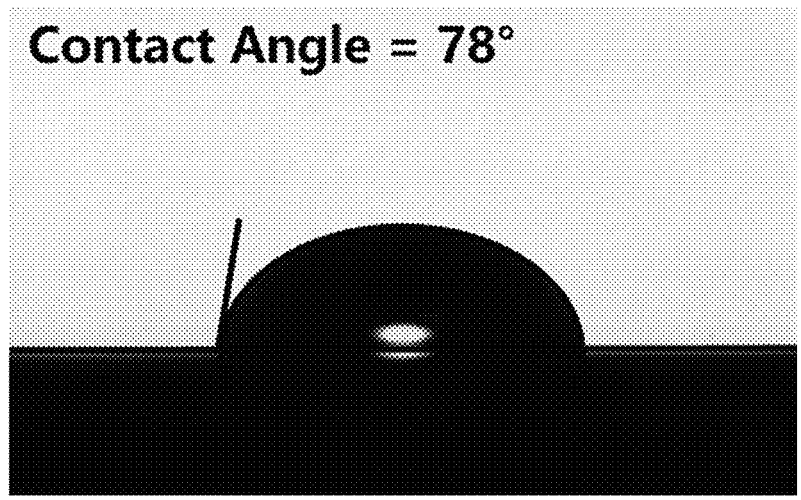
FIG. 5 illustrates a measurement diagram for a contact angle of an embodiment 6.
Figure 6:
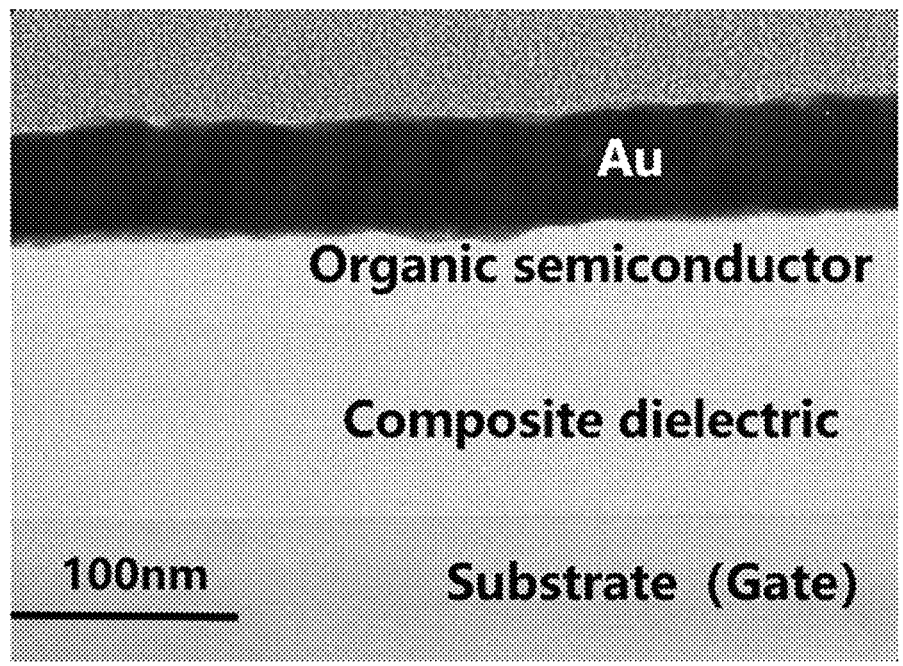
FIG. 6 illustrates a Transmission Electron Microscope (TEM) cross-sectional diagram of the organic thin film transistor having a bottom-gate top-contact structure in the embodiment 6.
Figure 7:
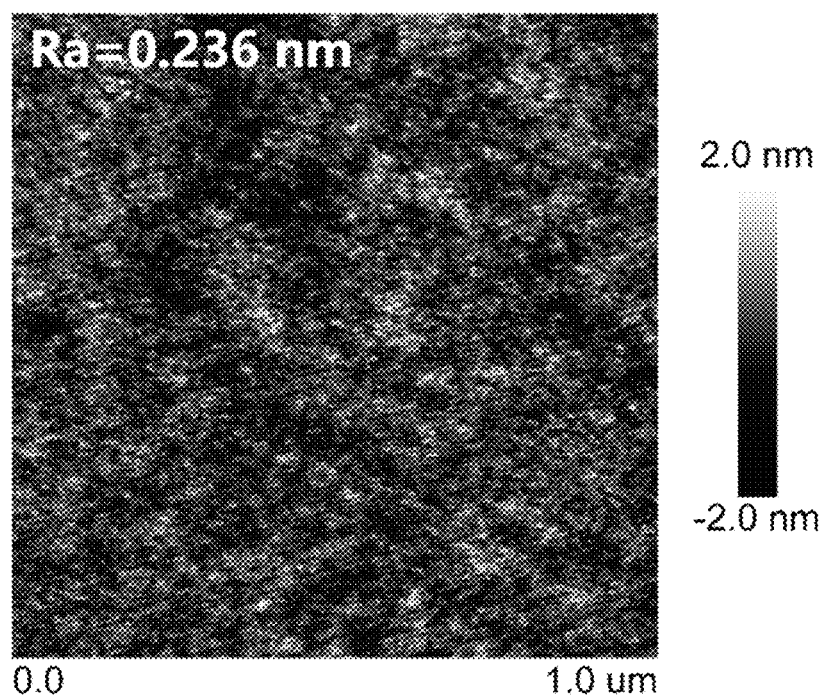
FIG. 7 illustrates an Atomic Force Microscope (AFM) characterization diagram of a surface in the dielectric in the embodiment 6.
Figure 8:
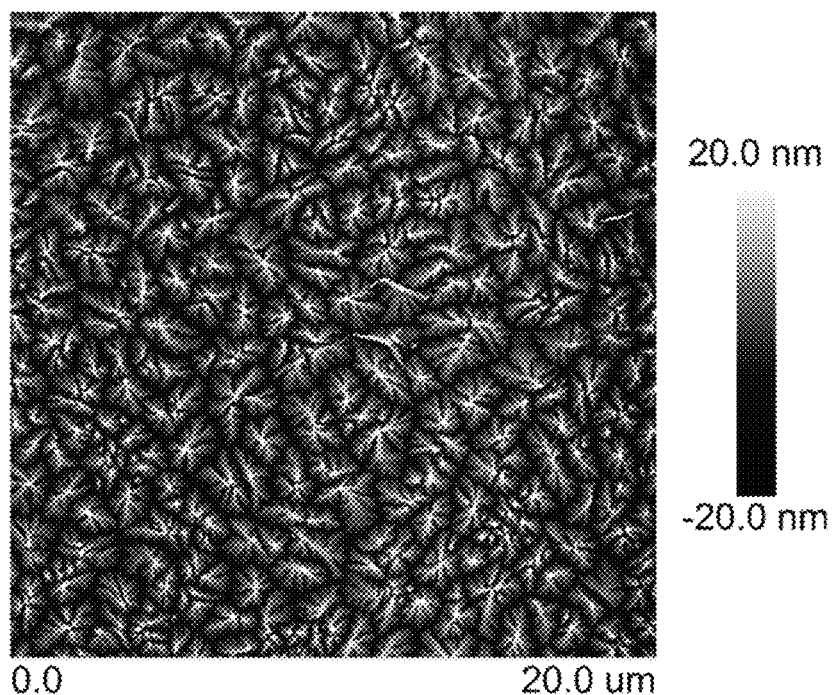
FIG. 8 illustrates an AFM characterization diagram of a graph showing a pentacene morphology in the embodiment 6.
Figure 9:
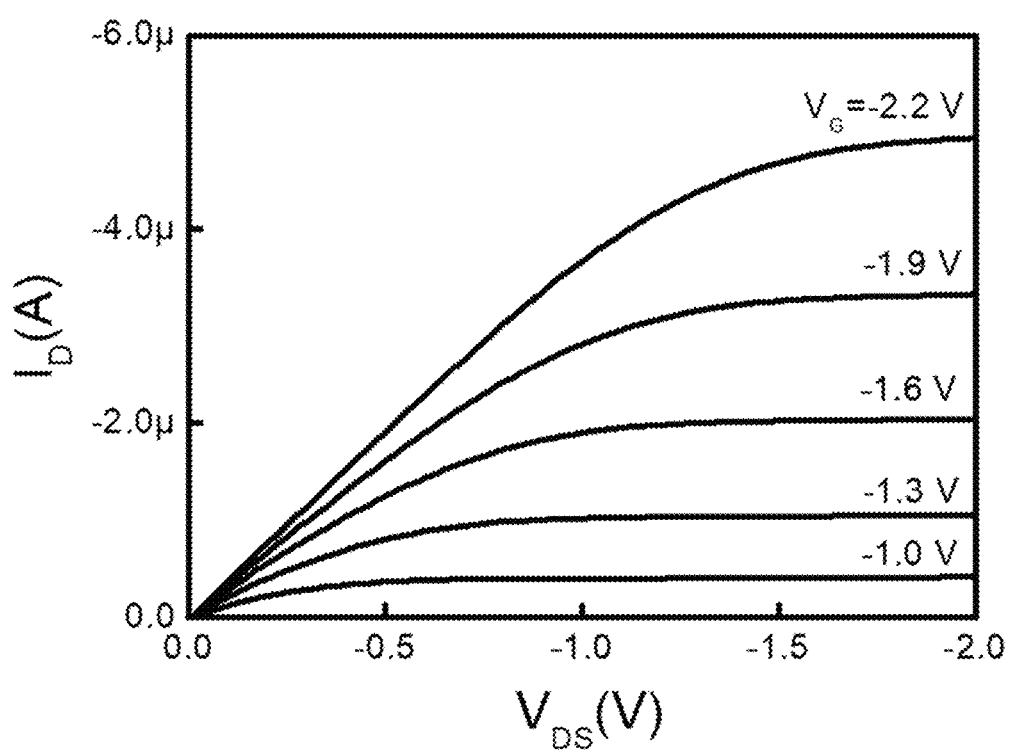
FIG. 9 illustrates an output characteristic curve of the organic thin film transistor in the embodiment 6.
Figure 10:
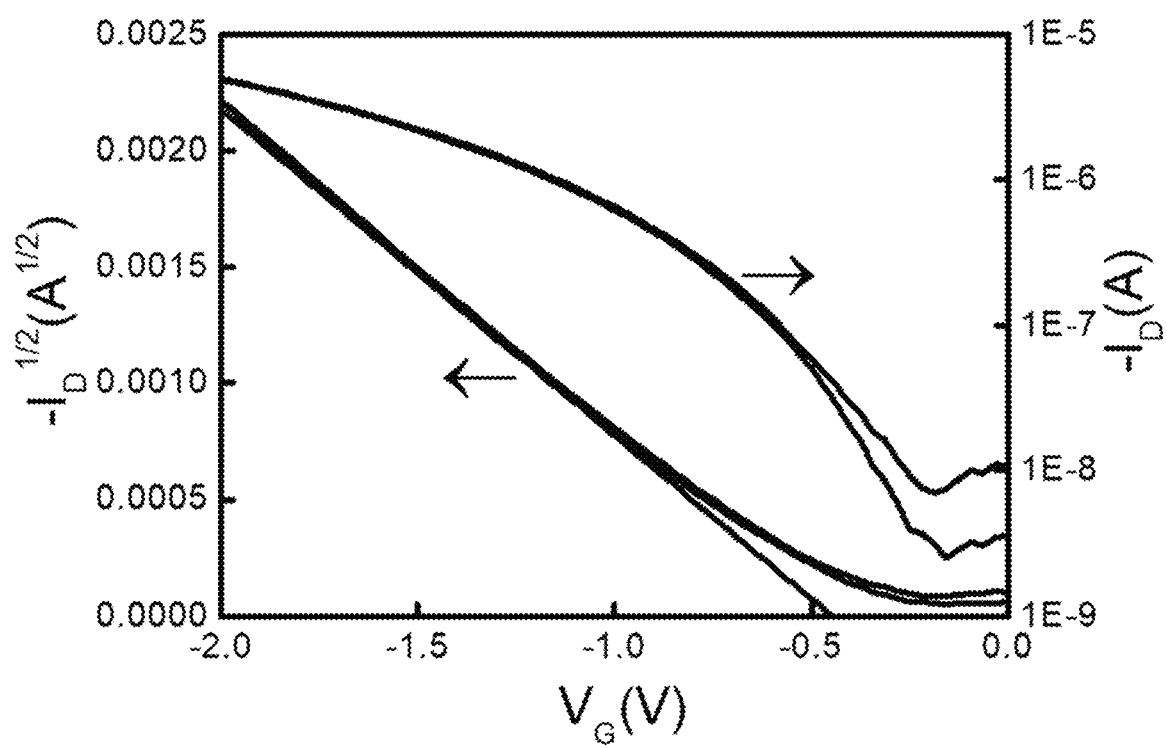
FIG. 10 illustrates a transfer characteristic curve of the organic thin film transistor in the embodiment 6.

FIG. 5 illustrates a measurement diagram for a contact angle of the present embodiment;

FIG. 6 illustrates a TEM cross-sectional diagram of the organic thin film transistor having a bottom-gate top-contact structure in the present embodiment;

FIG. 7 illustrates an AFM characterization diagram of a surface in the dielectric in the present embodiment;

FIG. 8 illustrates an AFM characterization diagram of a graph showing a pentacene morphology in the present embodiment;

FIG. 9 illustrates an output characteristic curve of the organic thin film transistor in the present embodiment;

FIG. 10 illustrates a transfer characteristic curve of the organic thin film transistor in the present embodiment.

Result Analysis

A plurality of results in each of the embodiments are shown in a table below:

| Embodiment | Film formation | Dielectric constant | Threshold voltage/v | Mobility $cm^2/V \cdot s$ | Hysteresis | Stability |
|---|---|---|---|---|---|---|
| 1 | — | 3.9 | −11.4 | 0.38 | Normal | Good |
| 2 | Good | 9.4 | −1.1 | 0.29 | Severe | Bad |
| 3 | Bad | — | — | — | — | — |
| 4 | Bad | — | — | — | — | — |
| 5 | Good | 15.86 | −0.90 | 1.53 | No | Good |
| 6 | Good | 10.62 | −0.47 | 5.77 | No | Good |

Referencing and comparing embodiment 1 and embodiment 2, the dielectric constant of the polymer PVA is higher than that of the inorganic $SiO_2$ material, and the threshold voltage (absolute value) of the polymer PVA is significantly lower than that of the conventional $SiO_2$ material, while the hysteresis of the polymer is obvious, and the device stability is poor. Embodiment 3 and embodiment 4 have a poor film formation, thus a device made thereof has almost no performance, while in the embodiment 5 and the embodiment 6, the dielectric constants of the organic-inorganic hybrid materials prepared using the methods in the present disclosure are 15.86 and 10.62 respectively, which are far larger than that of the $SiO_2$. A device based on the dielectric, not only shows a threshold voltage pretty low in absolute value (−0.90V and −0.47V respectively), but also has no significant hysteresis, having a relatively good stability in the air. Additionally, in the embodiment 5 and the embodiment 6, following an optimization of the terminal group in the coupling agent, the dielectric constant has a relatively large change. And the pentacene grown on the dielectric in the embodiment 6 has a relatively large crystal grain, and the mobility of the device has also a large improvement.

It should be understood that, the application of the present disclosure is not limited to the above examples listed. Ordinary technical personnel in this field should notice that all the improvement such as replacement, substitution or combination within the scope of the appended claims or the principle of the present disclosure should belong to the scope of protection of the present disclosure.

What is claimed is:

1. A method for preparing a dielectric material, comprising a sol-gel method, a silane coupling agent containing terminal group is co-hydrolyzed under an action of a catalyst to form a silica sol containing functional terminal group, then mixed with an organic polymer to form an organic-inorganic composite sol after a cross-linking reaction, the organic-inorganic composite sol is applied as a material of a dielectric in an organic thin film transistor; wherein the method further comprising:

S1, adding a quantitative silane coupling agent containing terminal group and a certain proportion of a solvent to a round bottom flask, before being heated in an oil bath at a temperature of 50-100° C. and stirred for 0.5-5 h;

S2, adding an appropriate amount of a catalyst to make an pH value of the solution at 2-6 or 8-12, continue stirring for 1-2 hours, before obtaining a silica sol containing functional terminal group;

S3, heating and dissolving the organic polymer in a solvent at 80° C. for 1-5 h, before obtaining an organic polymer solution in a certain concentration for use; and S4, adding the organic polymer solution to the silica sol containing functional terminal group, and stirring for 2 h at 60° C., before obtaining an organic-inorganic hybrid composite sol.

2. The method according to claim 1, wherein the silane coupling agent containing terminal group is selected from a group consisting of: γ-aminopropyltrimethoxysilane, aminopropyltriethoxysilane, 3-glycidoxypropyltrimethoxysilane, γ-methacryloxypropyltrimethoxysilane (KH570), vinyltriethoxysilane, vinyltrimethoxysilane, N-(β-aminoethyl)-γ-aminopropyltrimethoxysilane, N-(β-aminoethyl)-γ-aminopropyltrimethoxysilane, γ-mercaptopropyltriethoxysilane, γ-mercaptopropyltrimethoxysilane, phenyltrimethoxysilane, phenyltriethoxysilane, methyltriethoxysilane, ethyltriethoxysilane, octadecyltrimethoxysilane, dodecyltrimethoxysilane, n-octadecyltrichlorosilane, n-hexadecyltrichlorosilane, n-dodecyltrichlorosilane, n-octyltrichlorosilane, γ-chloropropyltrichlorosilane, γ-chloropropylmethyldichlorosilane, perfluorododecyltrichlorosilane, heptadecafluorodecyltripropoxysilane, heptadecafluorodecyltriethyloxysilane, heptadecafluorodecyltrimethoxysilane, heptadecafluorodecyltriisopropoxysilane, tridecafluorooctyltriethoxysilane, tridecafluorooctyltrimethoxysilane, tridecafluorooctyltrichlorosilane, tridecafluorohexylpropyltrimethoxysilane, dodecafluoroheptylpropyldimethoxysilane, dodecafluoroheptylpropyltrimethoxysilane, trifluoropropyltriethoxysilane, monofluorotriethoxysilane, pentafluorophenyltriethoxysilane, cyanoethylmethyldimethoxysilane, or tetraethyl orthosilicate.

3. The method according to claim 1, wherein the functional terminal group in the silica sol containing functional terminal group is selected from a group consisting of: a halogen, a vinyl, a thiol, an amino, an epoxy, or an ester; and the organic polymer is selected from a group consisting of: polyvinyl alcohol, polymethyl methacrylate, polystyrene, poly(p-vinylphenol), poly-α-methylstyrene, polyisobutylene, polypropylene, polyvinylidene fluoride, polyvinyl chloride, polyester, perfluoro resin, polyurethane, acrylate, polyurethane acrylate, or epoxy resin.

4. The method according to claim 1, wherein the catalyst is catalyst is selected from a group consisting of: hydrochloric acid, sulfuric acid, phosphoric acid, acetic acid, oxalic acid, succinic acid, citric acid, sorbic acid, terephthalic acid, sodium hydroxide, potassium hydroxide, ammonia, sodium bicarbonate, disodium hydrogen phosphate, 2-amino-2-methyl-1-propanol, N-methylethanolamine, butylethanolamine triethanolamine, N-aminopropyl-methylethanolamine, or ammonium chloride.

5. The method for preparing a dielectric material according to claim 1, wherein the solvent in the step S1 is selected from a group consisting of: deionized water, methanol, ethanol, propanol, isopropanol, benzyl alcohol, ethylene glycol, or glycerol; and the solvent in the step S3 is selected from a group consisting of: deionized water, methanol, ethanol, ethylene glycol, acetone, toluene, dichloromethane, ethyl acetate, chloroform, hexane, cyclohexane, or tetrahydrofuran.

6. A dielectric of an organic thin film transistor, wherein using the dielectric material prepared by the method according to claim 1, and forming an organic-inorganic composite film containing functional terminal group on a substrate to form a dielectric after being cured.

7. The dielectric of an organic thin film transistor according to claim 6, wherein a method for forming the organic-inorganic composite film comprising spin coating, dip coating, ink jet printing, 3D printing; a film thickness of the organic-inorganic composite film is 50-2000 nm; and a curing mode is heat curing or light curing.

8. An organic thin film transistor, wherein preparing an organic semiconductor and an electrode on the dielectric according to claim 6 respectively, before obtaining the organic thin film transistor.

9. The organic thin film transistor according to claim 8, wherein the organic semiconductor is a p-type semiconductor or an n-type semiconductor; the organic thin film transistor has any one of a bottom-gate bottom-contact structure, a bottom-gate top-contact structure, a top-gate bottom-contact structure, or a top-gate top-contact structure.

* * * * *